United States Patent [19]

Davis

[11] 4,409,560
[45] Oct. 11, 1983

[54] OUTPUT TRANSIENT SUPPRESSION CIRCUIT

[75] Inventor: William F. Davis, Tempe, Ariz.

[73] Assignee: Motorola, Inc., Schaumburg, Ill.

[21] Appl. No.: 220,612

[22] Filed: Dec. 29, 1980

[51] Int. Cl.³ .......................... H03F 3/04; H03K 5/22
[52] U.S. Cl. ..................................... 330/296; 307/236
[58] Field of Search ............... 330/296; 307/456, 473, 307/400, 255, 236

[56] References Cited

U.S. PATENT DOCUMENTS 4,063,116 12/1977 Schmoock ........................... 307/255
4,345,164 8/1982 Gies ..................................... 307/255
4,349,752 9/1982 Forte ................................... 307/255

Primary Examiner—James B. Mullins
Assistant Examiner—Gene Wan
Attorney, Agent, or Firm—Vincent B. Ingrassia

[57] ABSTRACT

An output circuit for driving a power stage includes circuitry for diverting displacement currents due to parasitic capacitance when power is first applied to the circuit. When power is first applied, a current sinking transistor turns on to divert such displacement current away from the power stage input. A switching transistor subsequently renders the current sinking transistor non-conductive to permit normal operation.

8 Claims, 1 Drawing Figure

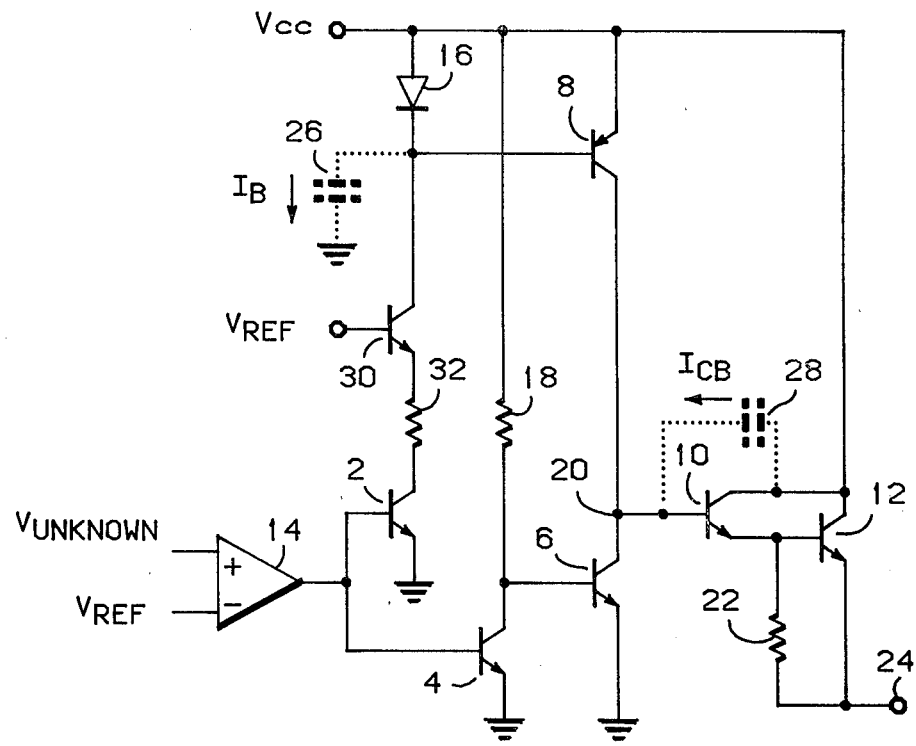

OUTPUT TRANSIENT SUPPRESSION CIRCUIT

BACKGROUND OF THE INVENTION

1. Field of the Invention

This invention relates generally to circuitry for driving an amplifier stage and, more particularly, to an output circuit which includes means for diverting displacement currents from the input of a power output stage so as to avoid extraneous outputs during rapid supply voltage excursions.

2. Description of the Prior Art

Many circuits are known for driving an output amplifying stage such as a Darlington pair in accordance with the state of some internally generated signal. Typically, when the internally generated signal is in a high state, the output of the power or amplifying stage will also be high. In contrast, when the internally generated signal is low, the output is low. A problem arises, however, when the supply voltage ($V_{CC}$) is turned on since the rapid rise in supply voltage causes parasitic capacitances in the circuit to generate displacement currents which may enter the amplifier input causing extraneous outputs to appear.

SUMMARY OF THE INVENTION

It is an object of the present invention to provide an improved output circuit for driving an amplifier.

It is a further object of the present invention to provide an output circuit for driving a power output stage which can tolerate rapid increases in supply voltage without causing extraneous signals to appear at the output of the power stage.

It is a still further object of the present invention to provide an output circuit for driving a power output stage which includes means for diverting parasitic capacitive currents from the input of the power stage to avoid extraneous outputs during turn-on.

According to a first aspect of the invention there is provided an output circuit powered by a source of supply voltage and having an output node, comprising: first means for receiving an input signal capable of assuming first and second states, said second means including a current source coupled to said first means and to said output node for supplying current to said output node when said input signal is in said second state, said current source being turned off when said input signal is in said first state; and third means coupled to said second means and said output node for clamping said output node to said first voltage when said source of supply voltage is turned on, and third means comprising: current sinking means coupled to said output node for diverting current from said output node; and switching means coupled to said current sinking means and to said source of supply voltage for turning said current sinking means off when said input signal is in said second state.

According to a further aspect of the invention there is provided an output circuit powered by a source of supply voltage, comprising: first means for receiving an input signal capable of assuming first and second states; amplifying means having an input and an output; second means coupled to said first means and to said input for generating a first voltage at said input when said input signal is in said first state and for generating a second voltage at said input when said input signal is in said second state; and third means coupled to said second means and to said input for diverting displacement current due to parasitic capacitance away from said input during rapid supply voltage excursions.

BRIEF DESCRIPTION OF THE DRAWINGS

The above and other objects, features and advantages of the present invention will be more clearly understood from the following detailed description taken in conjunction with the accompanying drawing which is a schematic diagram of the inventive output circuit.

DESCRIPTION OF THE PREFERRED EMBODIMENT

Referring to the drawing, a comparator 14 has an inverting input coupled to a reference voltage ($V_{REF}$), a non-inverting input coupled to an unknown voltage ($V_{UNKNOWN}$) and an output coupled to the base of transistors 2 and 4. The emitter of transistor 2 is coupled to ground, and its collector is coupled via resistor 32, transistor 30 and diode 16 to a source of supply voltage $V_{CC}$. The base of transistor 30 is coupled to $V_{REF}$. The emitter of transistor 4 is coupled to ground and its collector is coupled to the base of transistor 6 and, via resistor 18, to the source of supply $V_{CC}$. Transistor 8 has an emitter coupled to the supply voltage $V_{CC}$, a base coupled to the cathode of diode 16 and a collector coupled to the collector of transistor 6, the emitter of which is grounded. A power output stage including Darlington pair 10 and 12 has an input (the base of transistor 10) designated node 20 coupled to the common collectors of transistors 6 and 8. A bypass resistor 22 is coupled between the emitters of transistors 10 and 12 and functions to bypass displacement current due to the parasitic capacitance 28 across the base-collector junction of transistor 12. The output of the circuit appears at terminal 24 which is coupled to the emitter of transistor 12.

During normal operation, an output signal will appear at terminal 24 in accordance with the output state of comparator 14. For example, if the output of comparator 14 is high, transistors 2 and 4 will be turned on. With transistor 4 on, no base drive will be supplied to transistor 6 thus maintaining transistor 6 in an off condition. Since current is being drawn by transistor 2, limited by resistor 32 and transistor 30 through diode 16, base drive will be supplied to transistor 8 turning it on. With transistor 8 on and transistor 6 off, a high voltage will be applied to the input of the Darlington pair (node 20) thus resulting in a high output at node 24.

If, on the other hand, the output of the comparator were low, transistors 2 and 4 would remain in an off condition thus causing base drive to be supplied to transistor 6 from the source of supply voltage $V_{CC}$ via resistor 18. Since transistor 2 is off, no current flows through resistor 32, transistor 30 or diode 16 and therefore no base drive is supplied to transistor 8 maintaining it in an off condition. Since transistor 6 is on, a low voltage will appear at node 20 which is the input to the power stage. Thus, a low voltage will appear at the output terminal 24.

As is shown in the drawing, parasitic capacitances 26 and 28 exist respectively at the base of transistor 8 and across the collector base junction of transistor 10. If proper precautions aren't taken, these parasitic capacitances will generate displacement currents $I_B$ and $I_{CB}$ as a result of the rapid supply voltage rise time which would occur when the supply voltage $V_{CC}$ is first turned on. These displacement currents, if allowed to enter the input of the power stage (i.e., the base of transistor 10), will cause extraneous outputs to appear at output terminal 24. This is prevented by the inventive circuitry in the following manner. Assuming that the output of the comparator 14 is low when the supply voltage is turned on, transistors 2 and 4 are nonconducting. However, base drive is being supplied to transistor 6 via resistor 18 when $V_{CC}$ exceeds the base-emitter drop of transistor 6 keeping transistor 6 on. As stated previously, since transistor 2 is off, transistor 8 will likewise be off. When the supply voltage rises above approximately 0.7 volts, transistor 6 will sink the displacement currents caused by parasitic capacitances 26 and 28. Thus, the input of the power stage is clamped to ground through the action of transistor 6 thus preventing extraneous outputs from appearing at output terminal 24 during the rapid supply voltage rise time.

If transistor 6 were allowed to remain on, no current would ever be supplied to the power stage. To avoid this, when the output of comparator 14 goes high, base drive will be supplied to transistor 4 turning it on. With transistor 4 on, base drive to transistor 6 is diverted through transistor 4 thus turning transistor 6 off.

It should be clear that transistors 2 and 4 need not be driven by a comparator. The above described suppression circuitry is applicable to any circuit whose output must remain zero during power turn on. Any control signal capable of assuming first and second stable states can be coupled into the bases of transistors 2 and 4 as long as such signal is not affected by the rapid supply voltage rise time during turn on.

The above description is given by way of example only. Changes in form and details may be made by one skilled in the art without departing from the scope of the invention.

I claim:

1. An output circuit powered by a source of supply voltage and having an output node, comprising:
   first means for receiving an input signal capable of assuming first and second states;
   second means coupled to said first means and to said output node for generating a first voltage at said output node when said input signal is in said first state and for generating a second voltage at said output node when said input signal is in said second state, said second means including a current source coupled to said first means and to said output node for supplying current to said output node when said input signal is in said second state, said current source being turned off when said input signal is in said first state; and
   third means coupled to said second means and said output node for clamping said output node to said first voltage when said source of supply voltage is turned on, said third means comprising: current sinking means coupled to said output node for diverting current from said output node; and switching means coupled to said current sinking means and to said source of supply voltage for turning said current sinking means off when said input signal is in said second state.

2. An output circuit according to claim 1 wherein said first means comprises a first transistor having a base coupled to said input signal, an emitter coupled to ground and a collector coupled to said source of supply voltage.

3. An output circuit according to claim 2 wherein said current source comprises a second transistor having a base coupled to the collector of said first transistor, an emitter coupled to said source of supply voltage and a collector coupled to said output node.

4. An output circuit according to claim 3 wherein said switching means comprises a third transistor having a base coupled to said input signal, an emitter coupled to ground and a collector coupled to said source of supply voltage.

5. An output circuit according to claim 4 wherein said current sinking means comprises a fourth transistor having a base coupled to said source of supply voltage and to the collector of said third transistor, an emitter coupled to ground and a collector coupled to said output node.

6. An output circuit powered by a source of supply voltage, comprising:
   first means for receiving an input signal capable of assuming first and second states;
   amplifying means having an input and an output;
   second means coupled to said first means and to said input for generating a first voltage at said input when said input signal is in said first state and for generating a second voltage at said input when said input signal is in said second state; and
   third means coupled to said second means and to said input for diverting displacement current due to parasitic capacitance away from said input during rapid supply voltage excursions.

7. An output circuit according to claim 6 wherein said second means includes a current source coupled to said first means and to said input for supplying current to said input when said input signal is in said second state, said current source being turned off when said input signal is in said first state.

8. An output circuit according to claim 7 wherein said third means comprises:
   a current sinking transistor having an emitter coupled to ground, a collector coupled to said input and a base coupled to said source of supply voltage, said current sinking transistor for diverting current away from said input; and
   a switching transistor having a base coupled to said input signal, an emitter coupled to ground and a collector coupled to the base of said current sinking transistor and to said source of supply voltage for turning said current sinking transistor off when said input signal is in said second state.

* * * * *